(12) United States Patent
Ritter

(10) Patent No.: US 9,603,270 B2
(45) Date of Patent: Mar. 21, 2017

(54) DOCKING MECHANISM FOR LOCKING AND UNDOCKING MULTIPLE ELECTRONIC INSTRUMENTS

(71) Applicant: THOMSON LICENSING, Issy de Moulineaux (FR)

(72) Inventor: Darin Bradley Ritter, Indianapolis, IN (US)

(73) Assignee: THOMSON LICENSING, Issy les Moulineaux (FR)

( * ) Notice: Subject to any disclaimer, the term of this patent is extended or adjusted under 35 U.S.C. 154(b) by 0 days.

(21) Appl. No.: 14/433,373

(22) PCT Filed: Sep. 26, 2013

(86) PCT No.: PCT/US2013/061810
§ 371 (c)(1),
(2) Date: Apr. 2, 2015

(87) PCT Pub. No.: WO2014/058620
PCT Pub. Date: Apr. 17, 2014

(65) Prior Publication Data
US 2015/0282352 A1    Oct. 1, 2015

Related U.S. Application Data

(60) Provisional application No. 61/712,649, filed on Oct. 11, 2012.

(51) Int. Cl.
*H05K 7/00* (2006.01)
*H05K 5/00* (2006.01)
(Continued)

(52) U.S. Cl.
CPC ......... *H05K 5/0221* (2013.01); *G06F 1/1632* (2013.01); *H05K 5/0021* (2013.01); *H05K 5/0247* (2013.01); *G06F 2200/1635* (2013.01)

(58) Field of Classification Search
CPC .......................................................... G06F 1/16
(Continued)

(56) References Cited

U.S. PATENT DOCUMENTS 4,680,674 A     7/1987   Moore
6,069,790 A *   5/2000   Howell ................. G06F 1/1632
                                                      292/122

(Continued)

FOREIGN PATENT DOCUMENTS

EP          1612645       1/2006
WO       WO2012122230    9/2012

*Primary Examiner* — Jerry Wu
(74) *Attorney, Agent, or Firm* — Robert Shedd; Jerome G. Schaefer

(57) ABSTRACT

A docking mechanism for locking and undocking multiple electronic instruments is provided which includes upper and lower instruments. The upper electronic instrument docks on a top cover of the lower electronic instrument. The upper electronic instrument comprises at least one hook receiving aperture. The lower electronic instrument has at least one hook aperture and at least one lift pusher aperture in the top cover; a button aperture on a side wall of the lower electronic instrument; and a sliding hook piece including a button at an end of the sliding hook piece that extends through the button aperture, at least one hook that extends through the hook aperture, and at least one lift pusher that extends through the lift pusher aperture. The sliding hook piece is slidably attached to the top cover and includes lifting means on the top cover that causes the lift pusher to move upward when the button is pressed to safely lift the upper electronic instrument off of the lower electronic instrument.

15 Claims, 11 Drawing Sheets

(51) Int. Cl.
*H05K 5/02* (2006.01)
*G06F 1/16* (2006.01)

(58) Field of Classification Search
USPC .................................................. 361/679.52
See application file for complete search history.

(56) References Cited

U.S. PATENT DOCUMENTS

| | | |
|---|---|---|
| 6,346,000 B1 | 2/2002 | Orr |
| 7,426,108 B2 | 9/2008 | Carnevali |
| 8,050,028 B2 | 11/2011 | Merz et al. |
| 8,241,050 B2 | 8/2012 | Xu et al. |
| 8,578,487 B2 | 11/2013 | Soeder |
| 2004/0075980 A1 | 4/2004 | Park |
| 2004/0201601 A1 | 10/2004 | Ke |
| 2005/0128687 A1 | 6/2005 | Liang et al. |
| 2009/0292852 A1 | 11/2009 | Justice et al. |
| 2012/0212910 A1 | 8/2012 | Katsuta et al. |
| 2012/0218722 A1 | 8/2012 | Yu |
| 2012/0307455 A1 | 12/2012 | Ritter et al. |

\* cited by examiner

DOCKING MECHANISM FOR LOCKING AND UNDOCKING MULTIPLE ELECTRONIC INSTRUMENTS

CROSS-REFERENCE TO RELATED APPLICATIONS

This application claims the benefit, under 35 U.S.C. §365 of International Application PCT/US2013/061810 filed Sep. 26, 2013 which was published in accordance with PCT Article 21(2) on Apr. 17, 2014 in English and which claims the benefit of U.S. provisional patent application No. 61/712,649 filed Oct. 11, 2012.

FIELD OF THE INVENTION

The invention relates to mounting and docking of electronic devices.

BACKGROUND

A need exists in the set top box industry for the capability of docking electronic instruments together so that they can function together. This need includes the ability to safely align the electrical connectors of the instruments without risk of damage during assembly such that the units are locked together and cannot separate accidentally. Furthermore, customers need to be able to easily undock or unlock the units from one another, for example with the push of a button, without damaging either unit.

It is a further need in the industry for a low cost docking concept and mechanism that requires a minimum of number of parts and low costs.

One of the reasons for the need for a novel docking concept is that more and more functions are expected from electronics in homes and there are limits as to how many functionalities with which individual devices can be equipped. In this light, a convenient and low cost coupling mechanism for electronic components can provide a methodology to combine electronic components of different functionalities easily and/or replace components with others without the need to open any casings and changing interior components. Rather, casings comprising electronic devices with certain capabilities can be stand-alone units that can be interchanged and coupled with other casings.

SUMMARY OF THE INVENTION

Disclosed is a mechanism with few parts that allows a customer to push to connect two electronic instruments. Guide pins and other interlocking part geometry aligns the two instruments and the necessary connectors so that the customer can then push the two instruments together. Spring loaded hooks then deflect around apertures to allow insertion and then return into place to lock the two instruments together. Pushing a button on the side of one instrument then moves the locking hooks so that they unhook and at the same time, lifting pushers move upward to separate the two instruments and disconnect the electronic connectors without damage. This functionality is accomplished with a minimum number of parts.

Embodiments of the docking instrument system according to the invention can include: a lower electronic docking instrument 2 having a top cover 16; at least one hook aperture and at least one lift pusher aperture in the top cover; a button aperture on a side wall of the lower electronic docking instrument; a sliding hook piece 13 including a button 6 at an end of the sliding hook piece that extends through the button aperture, at least one hook 4 that extend through the hook apertures, and at least one lift pusher that extends through the lift pusher apertures, wherein the sliding hook piece 13 is slidably attached to the top cover; and a lifting means 20 on the top cover that cause the lift pushers to move upward when the button pressed. The sliding hook piece can be a generally planar body that is parallel to an interior top surface of the top cover in which the hooks extend upward from the planar body. The sliding hook piece can include lifting pushing levers 19 from which the lift pushers extend upward. The lifting pushing levers slide on the lifting means to cause the lift pushers to move upward when the button is pressed. The lifting pushing levers 19 can include a flat portion that pivots about a pivot hinge 42 in which one part of the flat portion on one side of the pivot hinge 42 supports the lift pusher lever and a second part of the flat portion on a second side of the pivot hinge 42 engages the lifting means when the button 6 is pressed such that the flat portion rotates about the pivot hinge as the second part engages the lifting means that causes the lift pushers to move upward. The lifting means can be a ramp 20 on the interior top surface of the top cover, in which the second part slides up the ramp when the button in pressed causing the flat portion to rotate. The interior top surface of the top cover can include at least one retaining rib 15. The sliding hook piece can include at least one spring finger 14 that is spring loaded on the retaining rib to urge the sliding hook piece toward the button aperture, wherein the spring fingers can also urge the button and the hooks toward the side wall having the button aperture of the lower electronic docking instrument. The interior top surface of the top cover can include at least one retention tab 22 that each form a slot that holds an edge of the pivot hinge, wherein the retention tab permits the sliding hook piece 13 to be slidably attached to the top cover. The generally planar body of the sliding hook piece can include a front strip portion 23 from which the button extends and an opposing back strip portion 34 with flat protrusion or edge 35. The flat protrusion or edge can be positioned within at least one edge slot formed by at least one edge retention tab 36 that forms from the interior top surface of the top cover and the edge retention tab also permits the sliding hook piece 13 to be slidably attached to the top cover. Further, the docking instrument system can include an upper electronic instrument 1 that docks on the top cover of the lower electronic docking instrument, wherein the upper electronic instrument comprises at least one hook receiving aperture 11 that engages the hook. The system can further include at least one guide pin aperture 10 in the upper electronic instrument and at least one guide pin 5 that extends upward from the top cover in which the guide pin enters the guide pin aperture to align the upper electronic instrument with the lower electronic instrument. The system can further include feet 3 extending downward from the upper electronic instrument and feet pockets on the top cover in which the feet enter the feet pockets to align the upper electronic instrument with the lower electronic instrument. The system can further include the feature an electronic connector 12 on a bottom side the upper electronic instrument engaging a lower electronic connector 7 on the top cover of the lower electronic instrument.

Other embodiments of the invention relate to heat management of the docking instrument system which include having the sliding hook piece being a generally planar body that comprises: a front strip portion 23 from which the button extends; an opposing back strip portion 34 with flat protrusion or edge 35; two side strip portions that extend between the front strip portion and the opposing back strip portion; and a hollow central region 44 defined by the front strip portion, opposing back strip portion, and the two side portions. In this case, the lower electronic docking instrument 2 can have vents 27 in the top cover; and the hollow central region is directly under at least one of the vents to permit air flow between the interior of the lower electronic docking instrument and the vents through the hollow central region. The upper electronic instrument can include bottom vents on a bottom side that face the top cover.

BRIEF DESCRIPTION OF THE DRAWINGS

The invention will be explained in detail with reference to the drawings in which.

DETAILED DESCRIPTION OF THE EMBODIMENTS

Figure 1:
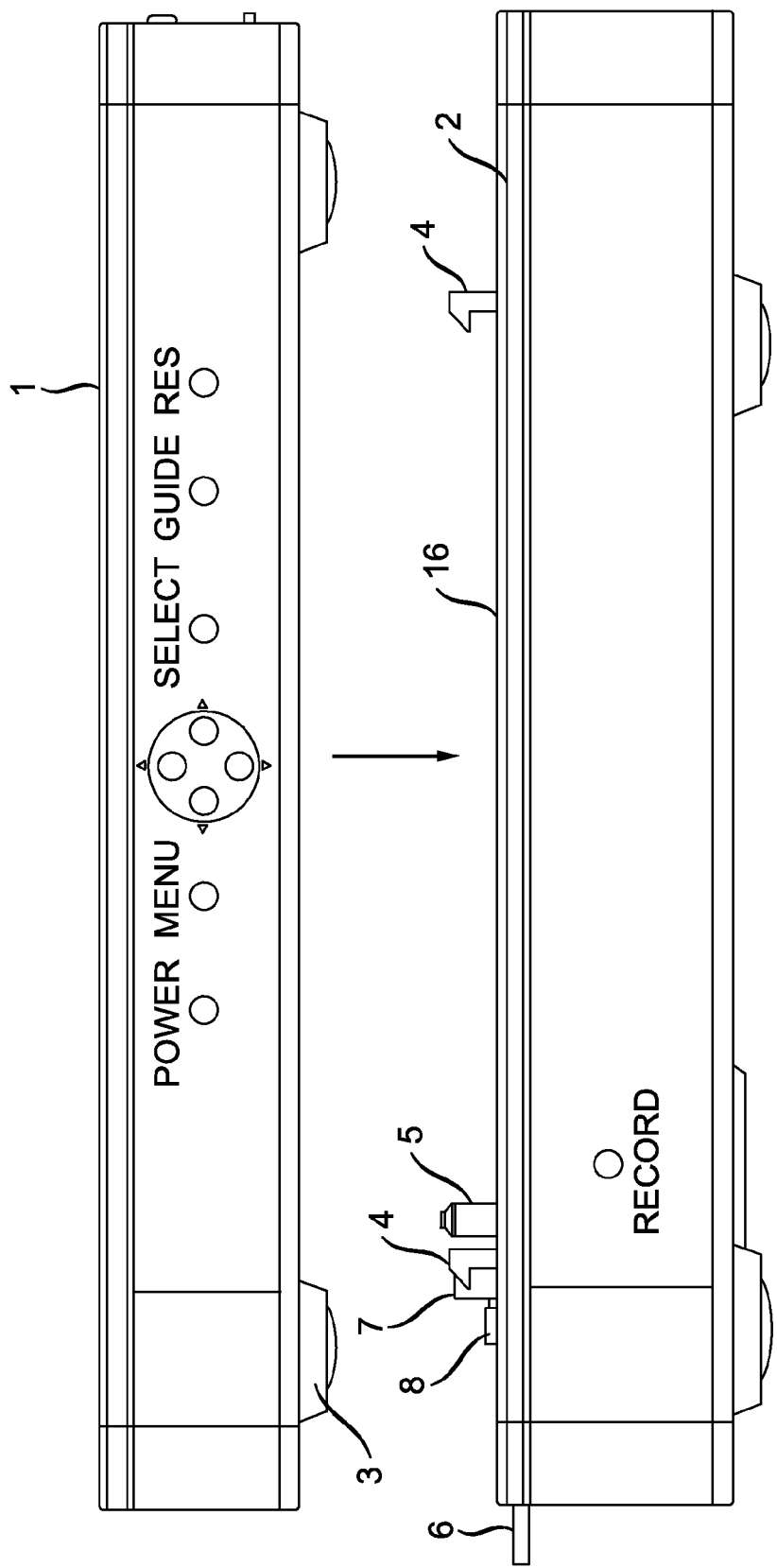
FIG. 1 is a front view of the lower electronic instrument 2 and upper electronic instrument 1 being engaged using the docking concept according to the invention.

The focus of the docking system according to the invention is a molded plastic sliding hook piece 13. This main mechanism has many functions integrated into one part. Other significant features of the invention are integrated into a molded plastic top cover 16 of the lower electronic docking instrument 2. Other features are further integrated into the floor of the other upper electronic instrument 1.

In short, the docking system can include: a sliding hook piece 13 that fits into retaining features molded into the molded plastic top cover of the lower docking unit 2 which is referred to the lower electronic docking instrument 2; hooks 4 and pushing lifters 8 of the piece 13 fit through openings in the top cover 16, wherein the sliding hook piece 13 is assembled into the top cover of the lower electronic docking instrument 2 by feeding the hooks 4 and pushing lifters 8 through the openings and then sliding the piece 13 so that spring fingers 14 are then pushed past a retaining rib or ribs 15 in which the spring fingers contact the rib 15 on a side of the rib 15 that faces the front edge or front strip portion 23 of the sliding hook piece 13; and an opening in the side of the top cover 16 that allows a button 6 to protrude from the side of the top cover, wherein the spring fingers 14 load the sliding piece 13 so that the button 6 protrudes out of an aperture of the lower electronic docking instrument 2. The piece 13 can generally be a planar structure of narrow strips and the spring fingers 14 can be molded as part of the piece 13 and be in the same general plane as the planar structure.

The docking feature of the invention can include: the sliding hook piece 13 having one or more hooks 4 with chamfers on the top edge that provide angled lead in for insertion during docking, wherein these hooks 4 protrude above the lower electronic docking instrument 2; two or more guide pins 5 molded into the top cover 16; pockets 17 on the top surface of the top cover 16 also being provided to interlock with the mounting feet 3 of the upper electronic instrument 1, wherein the upper electronic instrument has apertures 10 that engage guide pins 5 from the lower electronic docking instrument 2; and hook receiving apertures 11 that engage dock hooks 4 from the lower electronic docking instrument 2. The user places the upper electronic instrument 1 on the lower electronic docking instrument 2, wherein the feet pockets 17 provide gross alignment and the guide pins 5 provide fine alignment. The user then pushes straight down, and the hooks 4 from the lower electronic docking instrument 2 push to the side as the units come together and then lock into place when the units are completely pressed together. The chamfers on the openings of the upper unit and the top edge of the hooks enable the sliding motion. The spring fingers 14 of the sliding hook piece 13 deflect to allow the sliding motion and then push the hooks into place once the barb of the hooks 4 pass the edge of the openings.

The undocking feature of the invention can include: a button 6 protruding through the side of the lower electronic docking instrument 2 for when the user wants to undock the upper electronic instrument 1, wherein the user pushes on the button 6 and the sliding hook piece 13 moves to the side; and lifting pushing levers 19 are molded with pivot hinges so that when the user pushes the button 6 on one side of the piece 13, one side of the lever 19 slides up a ramp 20 molded in the top cover 16, wherein the other side of the lever (i.e. pushing lifters 8) then moves upward and pushes the underside of the upper electronic instrument 1 near the electronic connector 12. The lifting pushing levers 19 can be a cross shape or t-shape in which two parallel and opposing segments are the pivot hinges, which corresponds to the horizontal lines of the t-shape. Of the other two parallel and opposing segments (i.e. the vertical lines of the t-shape) of the lifting pushing levers 19, one segment can be a flat portion that faces away from the front strip portion 23 and is the portion of the levers 19 that slides up the ramp 20. The pivot hinges are held in a constant plane by retention tabs 22, which can be raised horizontal planar structures that form slots that the edges of the pivot hinges or their supports can slide within and stay in a plane. The remaining opposing segment includes the lift pusher 8, wherein this segment faces the front strip portion 23 and this segment rises upward causing the lift pusher 8 to move upward to contact the bottom side of the upper electronic instrument 1 as the opposing segment of the lifting pushing lever slides up the ramp 20. These features safely overcome the connector retention force and push the connector 12 in a linear motion without twisting or rotation. The sliding motion also moves the retention hooks so that the upper electronic instrument can move upward. When the customer stops pushing on the button on the side, the spring fingers return the sliding hook piece to its original position.

Features of the invention will not be discussed in greater detail with reference to drawings.

FIG. 1 is front view of the lower electronic instrument 2 and upper electronic instrument 1 being engaged. FIG. 1 further shows how the upper electronic instrument 1 can have protruding feet 3 on its bottom to align with feet pockets 17 (not shown) in the top of the lower electronic instrument 2. The instruments can be hard drive, digital video recorders, set top box, DVD players, or the like. The lower electronic instrument 2 can have dock hooks 4 and guide pins 5 that protrude from and/or through the top of the lower electronic instrument 2. Electrical connector 7 can also protrude the top cover 16 of instrument 2 and can provide the interfacing and/or communication means between the two devices and/or the powering means to drive one of the two devices. The unlock button 6 is also shown which can protrude from and/or through a side of one of the devices. A lift pusher 8 can also be seen in FIG. 1 protruding from the top cover of the instrument 2. This lift pusher 8 is used for the undocking of the upper electronic instrument 1.

Figure 2:
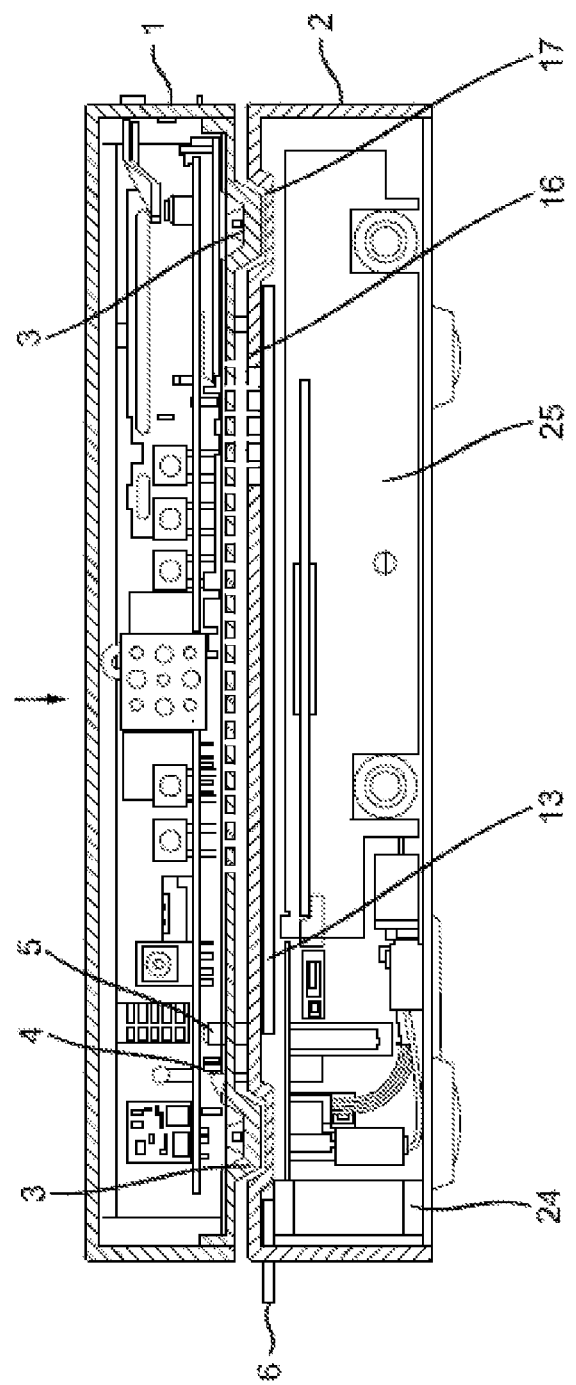
FIG. 2 is an interior front or rear view of lower electronic instrument 2 and upper electronic instrument 1 engaged according to the docking mechanism of the invention.

FIG. 2 is an interior front or rear view of lower electronic instrument 2 and upper electronic instrument 1 engaged or docked showing how protruding feet 3 of the upper electronic 1 rests or sits in the feet pockets 17 on the top cover 16 of the lower electronic instrument 2. This view shows how dock hooks 4 can have a L-shape edge surface that fits through an aperture in the bottom of instrument 1 and grasps an edge around the aperture to secure the two instruments together. One of the guide pins 5 is also shown which goes through a guide aperture of the instrument 1. This view shows that the instruments have a plurality of internal components such as fans 24 or hard drives 25. This view shows how the molded plastic sliding hook piece 13 can be a generally planar structure of narrow strips and have a push button 6 within the general plane of the structure that can extend beyond a side wall of the lower electronic instrument 2 and can have dock hook 4 that extends perpendicularly out of the plane to engage and upper electronic instrument 1. It should be noted that although the preferred material for the sliding hook piece 13 is plastic, the piece 13 can be other materials as long as they have the appropriate elasticity to function as a plastic material would function.

Figure 3A:
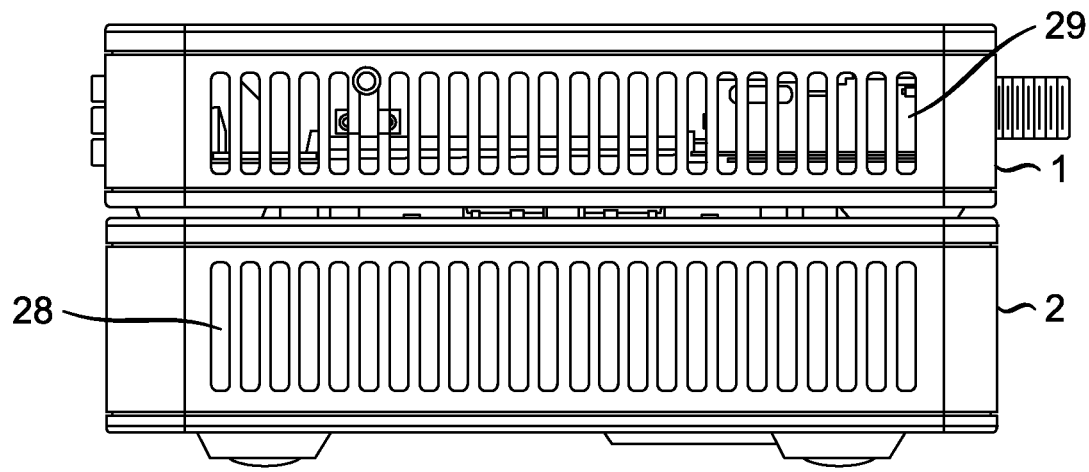
FIG. 3 shows two sides views of the lower electronic instrument 2 and upper electronic instrument 1 engaged according to the invention.
Figure 3B:
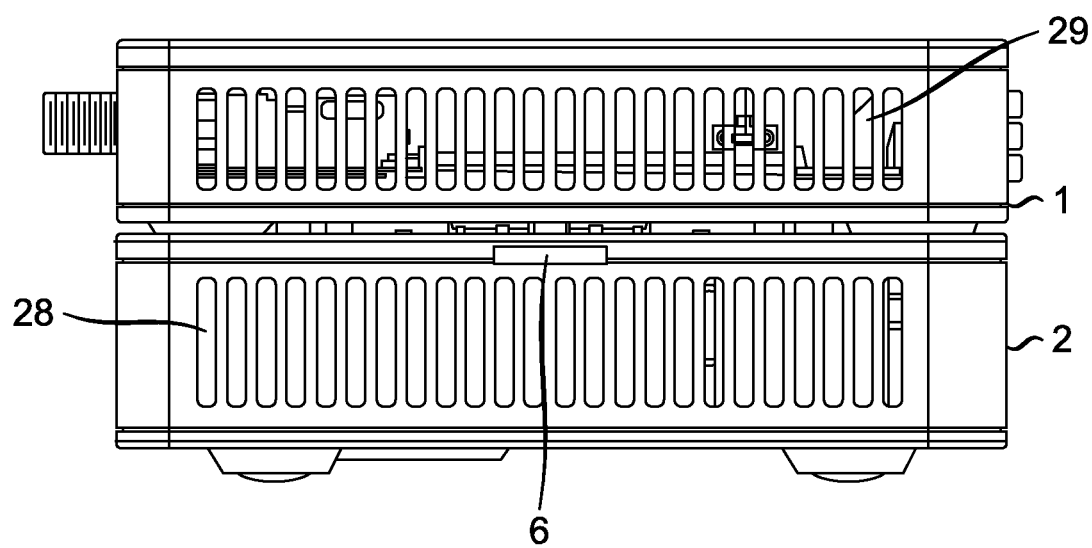

FIG. 3 shows views of both sides of the docket system and how the unlock button 6 can be positioned at the center of one of the sides to beneficially be positioned away from the front of the instruments to be less conspicuous and less likely to be accidently undocked. This view shows how the sides of either of the instruments can have vents thereon to promote the escape of heat. The vents can be vertical slots (as shown) on one or both sides and have heights greater than half of the height of the respective instruments. FIG. 3A shows the right side view of the lower electronic instrument 2 and upper electronic instrument 1 engaged and FIG. 3B shows the left side view of the lower electronic instrument 2 and upper electronic instrument 1 engaged in which the button 6 extends out of the lower electronic instrument 2.

Figure 4A:
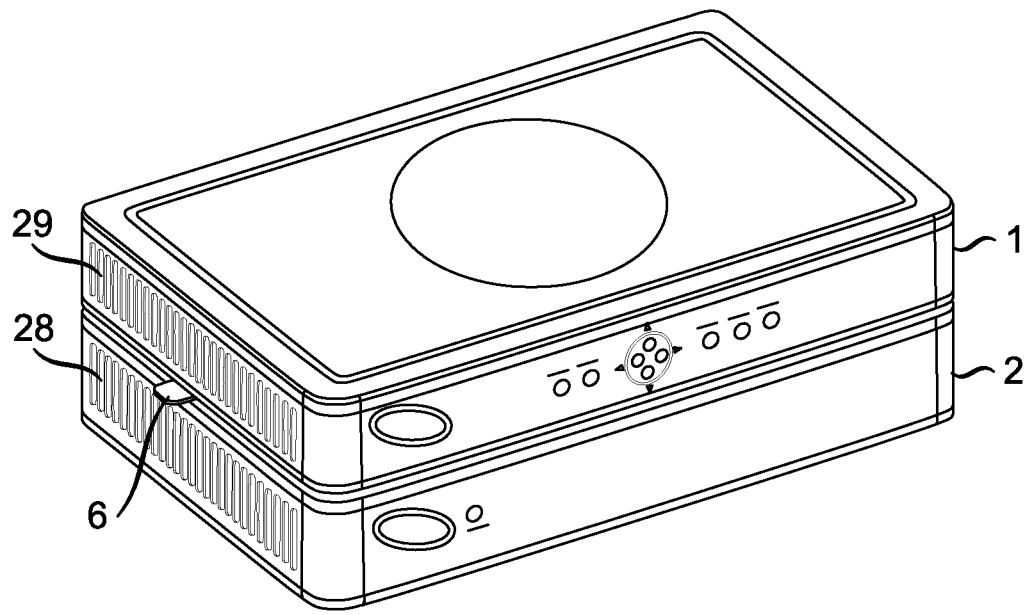
FIG. 4 shows perspective front and rear views of the lower electronic instrument 2 and upper electronic instrument 1 engaged or docked.
Figure 4B:
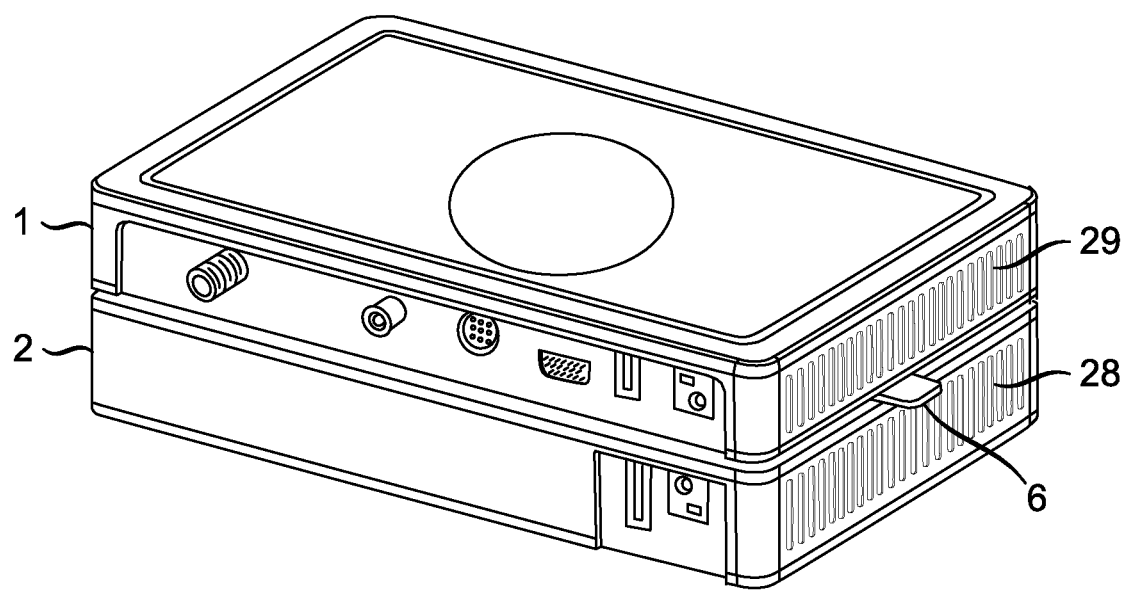

FIG. 4 shows perspective views of the lower electronic instrument 2 and upper electronic instrument 1 engaged or docked. FIG. 4A shows the front side view of the lower electronic instrument 2 and upper electronic instrument 1 engaged and FIG. 4B shows the left side view of the lower electronic instrument 2 and upper electronic instrument 1 engaged. Each view shows the button 6.

Figure 5:
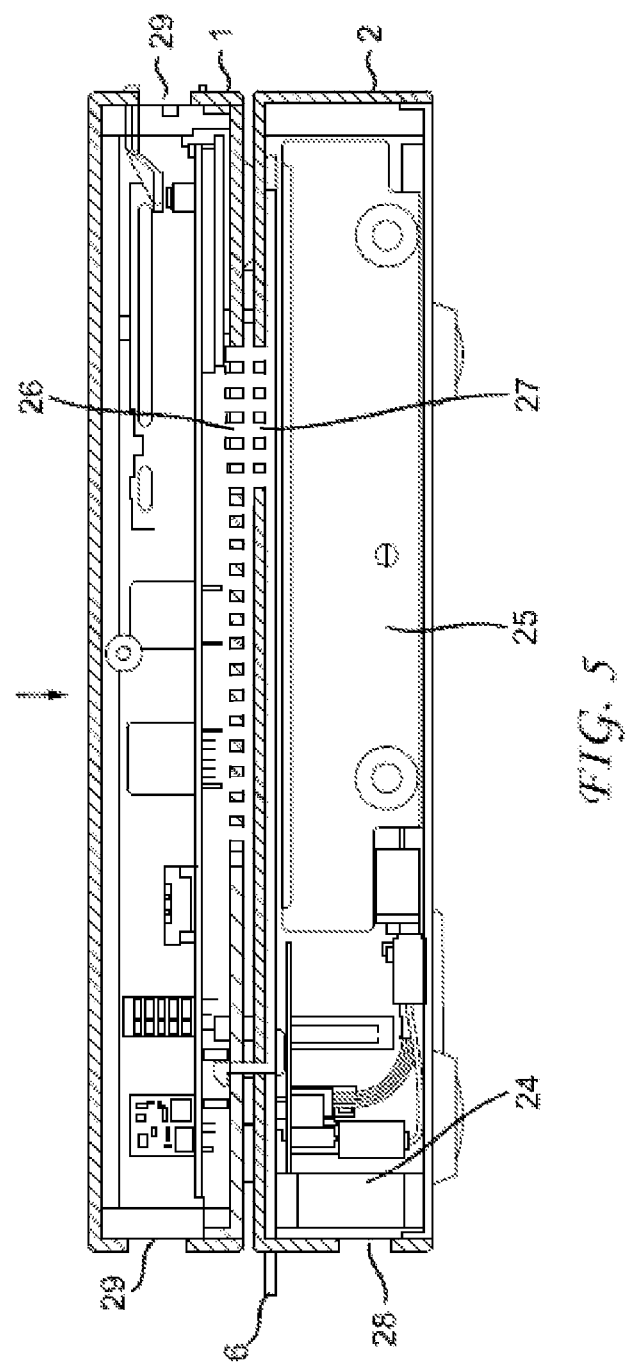
FIG. 5 is an interior front or rear view of lower electronic instrument 2 and upper electronic instrument 1 engaged showing a synergistic heat extraction mechanism according to the invention.

FIG. 5 is an interior front or rear view of the lower electronic instrument 2 and upper electronic instrument 1 engaged or docked, wherein the system can have an integrated heat management mechanism as opposed to each instrument individually managing heat release. In this configuration, one instrument (which can be the bottom one) can draw cooling air into the instrument in a horizontal fashion by using a fan 24 positioned at inlet vents 28 at the side of the lower electronic instrument 2 and the lower electronic instrument 2 can have outlet vents 27 at its top surface that permit cooling air to exit therethrough and enter the upper electronic instrument 1 through inlet vents 26 on its side facing the outlet vents 27. The cooling air will then exit the upper electronic instrument 1 through outlet vents 29. FIG. 5 shows a hard drive 25 in the lower electronic instrument 2 which can be a major heat generating source; however, other and different heat generating sources can be employed and present. The sliding hook piece 13 can be designed to promote this cooling feature by having a hollow central region 44 (See FIG. 9) that does not obstruct air or heat flow to and through the top cover 16.

Figure 6:
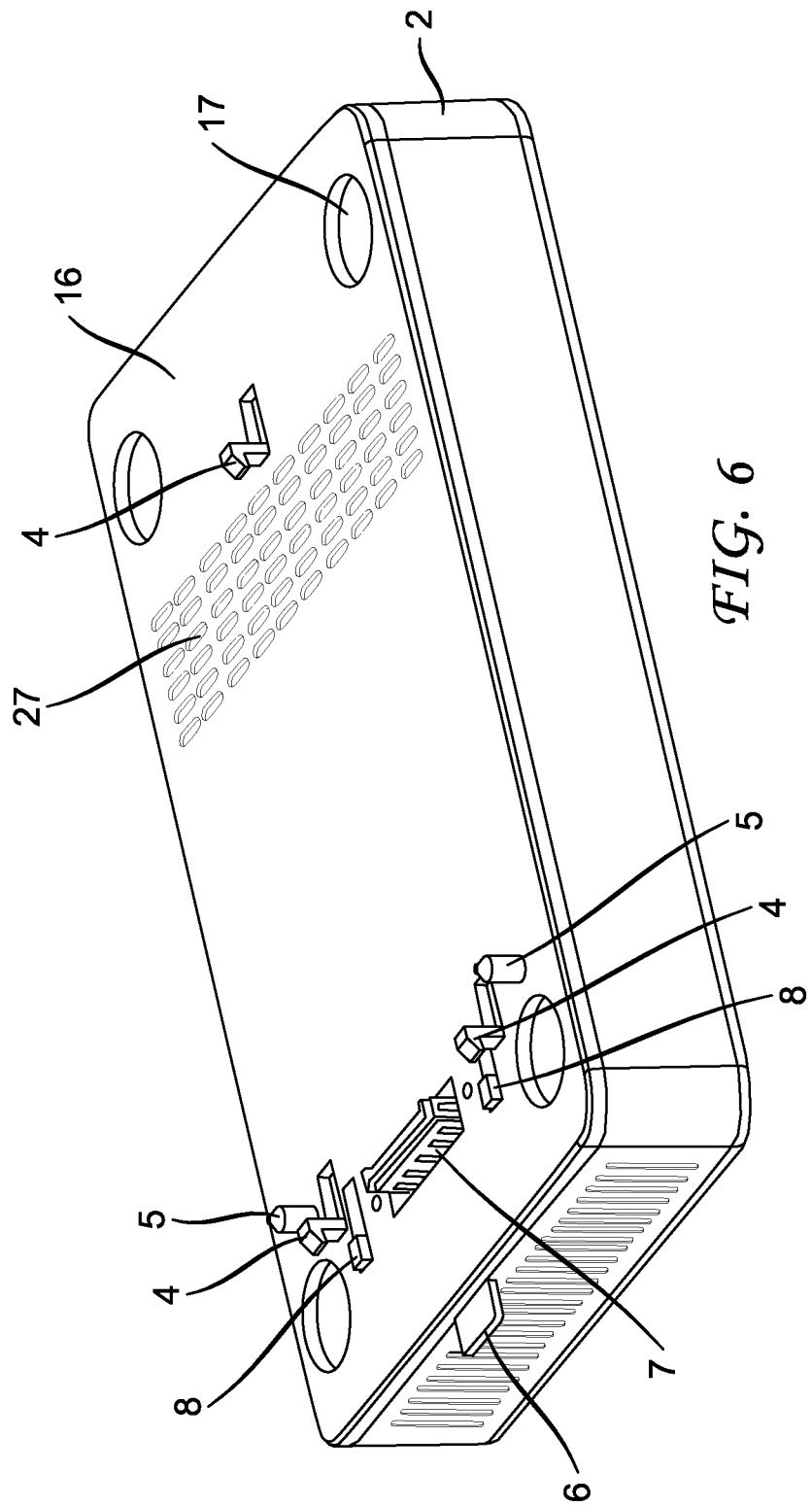
FIG. 6 is a top perspective view of the lower electronic instrument 2 showing various features according to the invention.

FIG. 6 is a top perspective view of the lower electronic instrument 2 showing various features. Particularly, this view shows various features of the sliding hook piece 13 that protrude through apertures on the top cover 16. The sliding hook piece 13 features which protrude through the top cover 16 can be the hooks 4, which have chamfers on the top edge that provide angled lead in for insertion during docking, the lift pushers 8 and the push button 6. It should pointed out that as the push button 6 is pressed in, the hooks simultaneously move in the same direction as the button 6 and the lift pushers 8 simultaneously move upward. Other components shown include two or more guide pins 5 molded into the top cover 16 and feet pockets 17 on the top surface of the top cover 16, which are provided to interlock or engage with the mounting feet 3 of the upper electronic instrument 1, wherein the upper electronic instrument has apertures 10 that engage guide pins 5 from the lower electronic docking instrument 2. FIG. 6 further shows the plurality of outlet vents 27 and how electrical connector 7 can protrude through the top cover 16.

Figure 7:
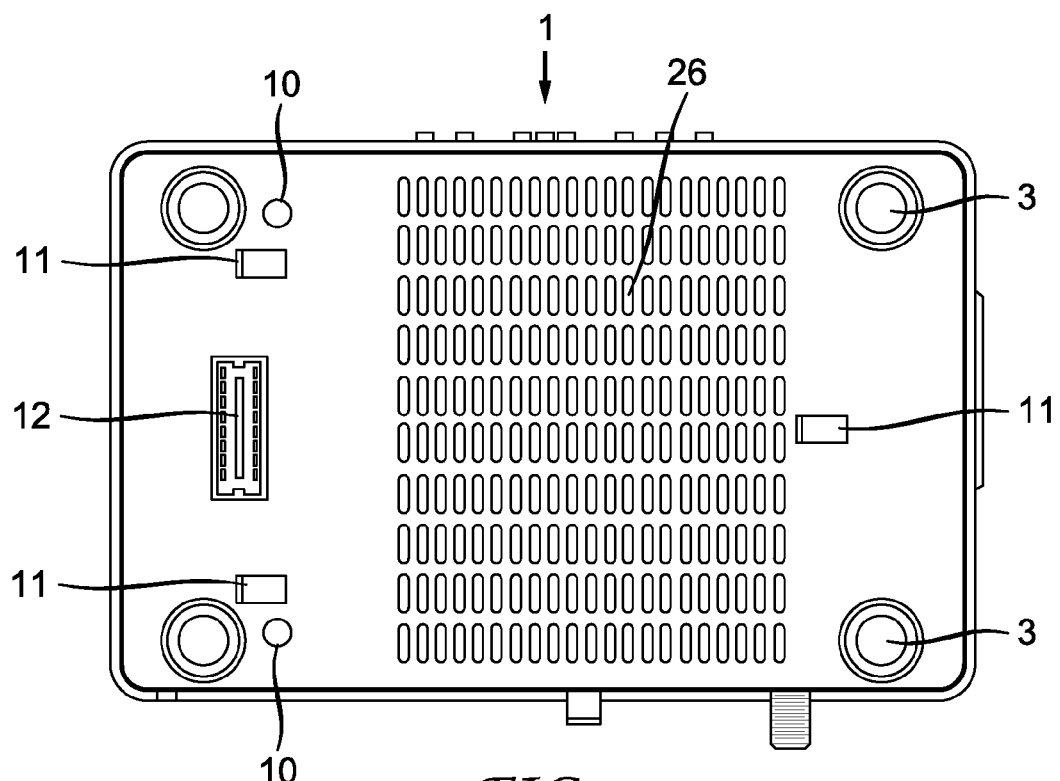
FIG. 7 is a bottom plan view of the upper electronic instrument 1 showing the various features according to the invention.

FIG. 7 is a bottom view of the upper electronic instrument 1 and shows the various engagement structures that are adapted to engage with the parts of the lower electronic instrument 2. For example, apertures 10 engage guide pins 5, apertures 11 engage dock hooks 4, and connector 12 engages connector 7. The user places the upper electronic instrument 1 on the lower electronic docking instrument 2, wherein the mounting feet 3 of the upper electronic instrument 1 engaging the feet pockets 17 to provide gross alignment. The guide pins 5 provide fine alignment. The user then pushes straight down, and the hooks 4 from the lower electronic docking instrument 2 push to the side as the units come together and then lock into place when the units are completely pressed together. Chamfers on the apertures 11 of the upper electronic instrument 1 and on the top edge of the hooks enable the sliding motion. When the hooks 4 engage apertures 11, the spring fingers 14 (shown in FIG. 9) of the sliding hook piece 13 deflect to allow the sliding motion and then push the hooks into place once the barb of the hooks 4 pass the edge of the apertures 11. FIG. 7 also shows the inlet vents 26.

Figure 8A:
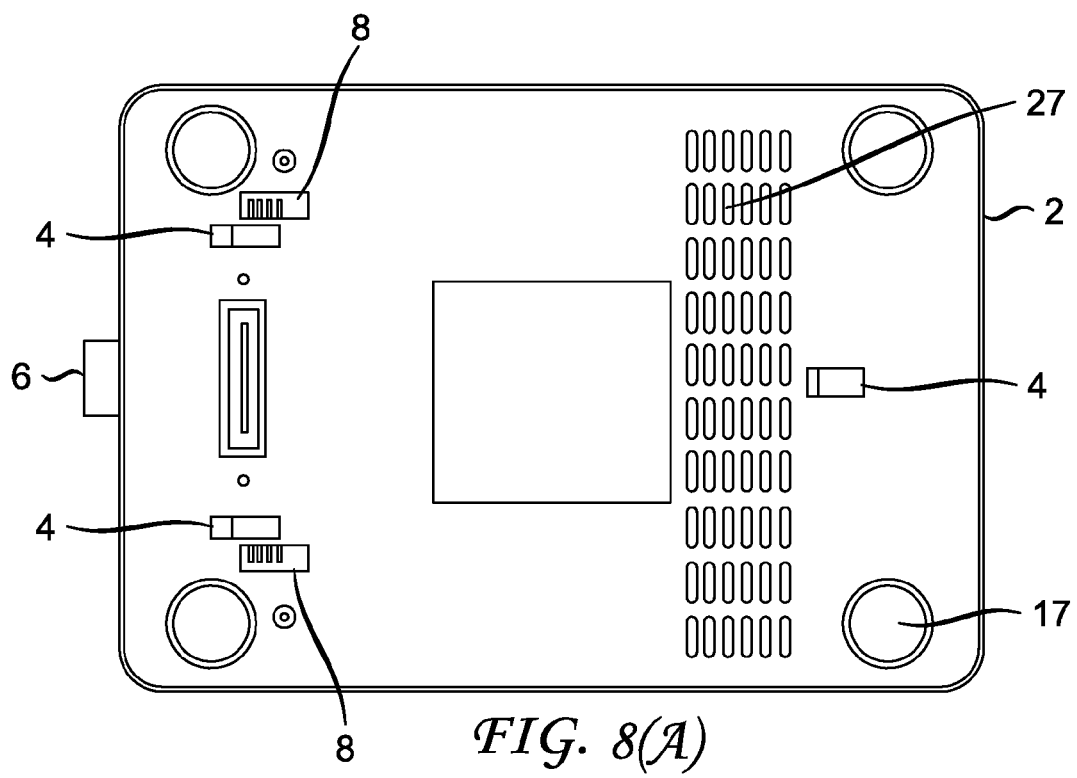
FIG. 8 shows plan top and bottom views of the lower electronic instrument 2 according to the invention.
Figure 8B:
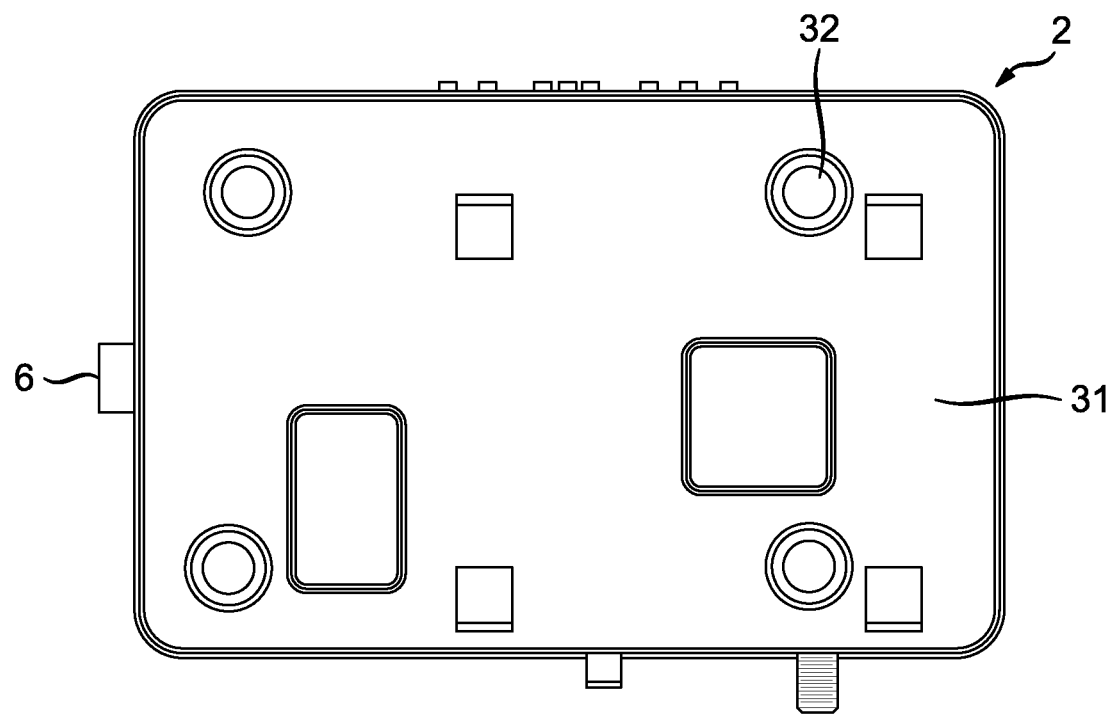
Figure 8C:
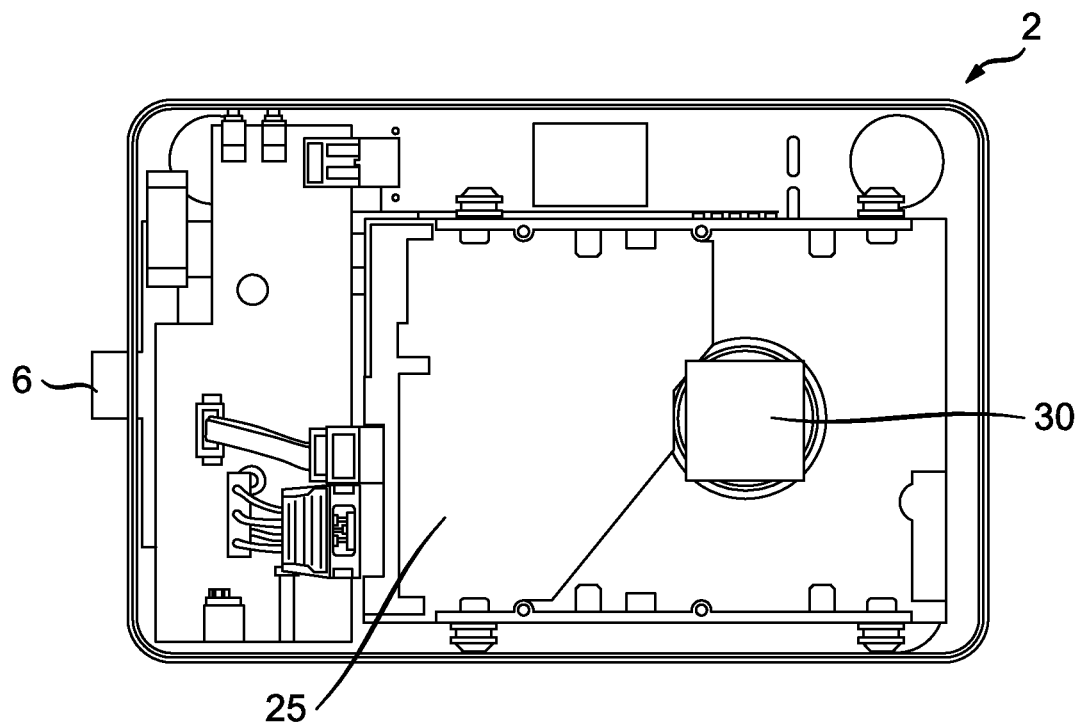

FIG. 8 shows various views of the lower electronic instrument 2 which exhibits another possible heat management feature. FIG. 8A shows a top plan view of the lower electronic instrument 2. FIG. 8B shows a bottom plan view of the lower electronic instrument 2 which includes outer casing 31 and bottom feet 32. FIG. 8C shows a bottom plan view of the lower electronic instrument 2 with the outer casing 31 removed to show the thermal pad 30. The thermal pad 30 can be positioned between the bottom of the outer casing 31 and an interior component such as a hard drive 25, which could be a circuit board, smart card reader, etc. The thermal pad 30 can conduct heat to the outer casing 31 of the lower electronic instrument 2 and result in heat spreading to the outer casing 31 and radiating out of the lower electronic instrument 2.

Figure 9:
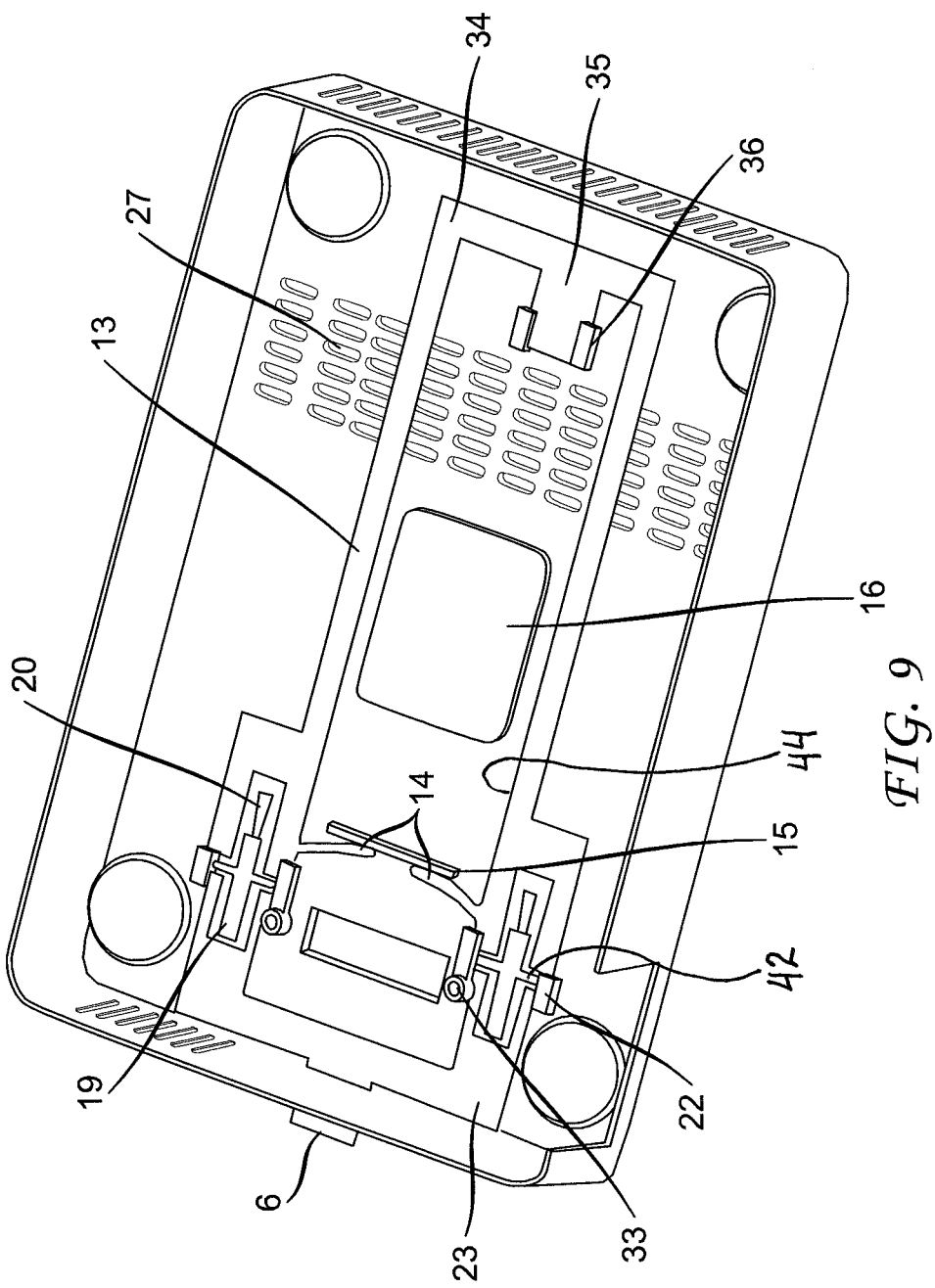
FIG. 9 is a bottom perspective view of the top cover 16 of the lower electronic instrument 2 showing the molded plastic sliding hook piece 13 according to the invention.

FIG. 9 is a bottom view of the top cover 16 of the lower electronic instrument 2 showing how the molded plastic sliding hook piece 13 can be configured and generally rest on the interior upper surface of the top cover 16 of the lower electronic instrument 2. The piece 13 can be a single piece of material that is generally flat as shown and is configured to integrate with the top cover 16. Screw or bolt hole 33 is shown on the top cover 16 which can be used for assembling the outer casing 31 to the top cover 16. As shown most clearly in FIG. 9, the sliding hook piece 13 is slidably attached to the top cover of the lower electronic docking instrument 2. The top cover 16 includes at least one hook aperture and at least one lift pusher aperture in the top cover. The sliding hook piece 13 includes a button 6 at an end of the sliding hook piece that extends through a button aperture, hooks 4 that extend through the hook apertures, and lift pushers 8 that extend through the lift pusher apertures. The top cover includes lifting means 20 on the top cover that can be ramps. The sliding hook piece can be a generally planar body that is parallel to an interior top surface of the top cover. The sliding hook piece can have the hooks extending upward from the planar body and lifting pushing levers 19 from which the lift pushers extend upward in which the lifting pushing levers 19 slide on the lifting means or ramps 20 to cause the lift pushers to move upward when the button pressed. The lifting pushing levers 19 can include a flat portion that pivots about a pivot hinge in which one part of the flat portion on one side of the pivot hinge supports the lift pusher 8 and a second part of the flat portion on the other side of the pivot hinge engages the ramp 20 when the button pressed. The flat portion rotates about the pivot hinge as the second part engages the lifting means that causes the lift pushers to move upward. Also, FIG. 9 shows the interior top surface of the top cover including at least one retaining rib 15 and the sliding hook piece including spring fingers 14 which are spring loaded on the retaining rib to urge the sliding hook piece toward the button aperture. Also, FIG. 9 shows the interior top surface of the top cover 16 including retention tabs 22 that each form a slot that holds an edge of the pivot hinge in which the retention tabs permit the sliding hook piece 13 to be slidably attached to the top cover. The generally planar body of the sliding hook piece 13 can include front strip portion 23 from which the button extends and an opposing back strip portion 34 with flat protrusion or edge 35, wherein the flat protrusion or edge 35 is positioned within at least one edge slot formed by at least one edge retention tab 36 that forms from the interior top surface of the top cover. The edge retention tab 36 also permits the sliding hook piece 13 to be slidably attached to the top cover 16.

Figure 10A:
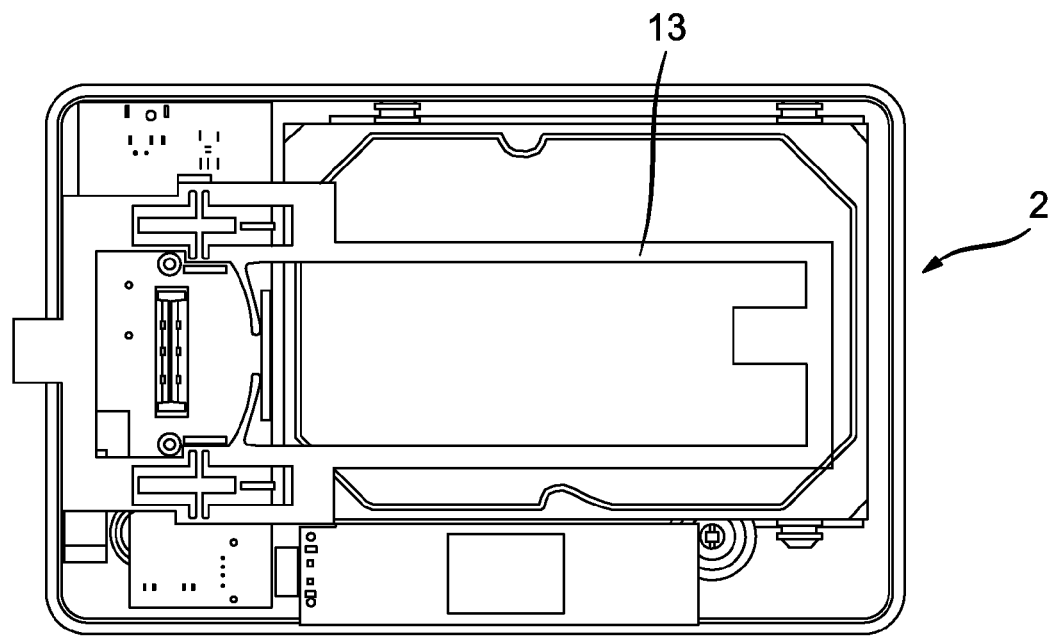
FIG. 10 shows interior views of lower electronic instrument 2 exhibiting the top surface features of the sliding hook piece 13 according to the invention.
Figure 10B:
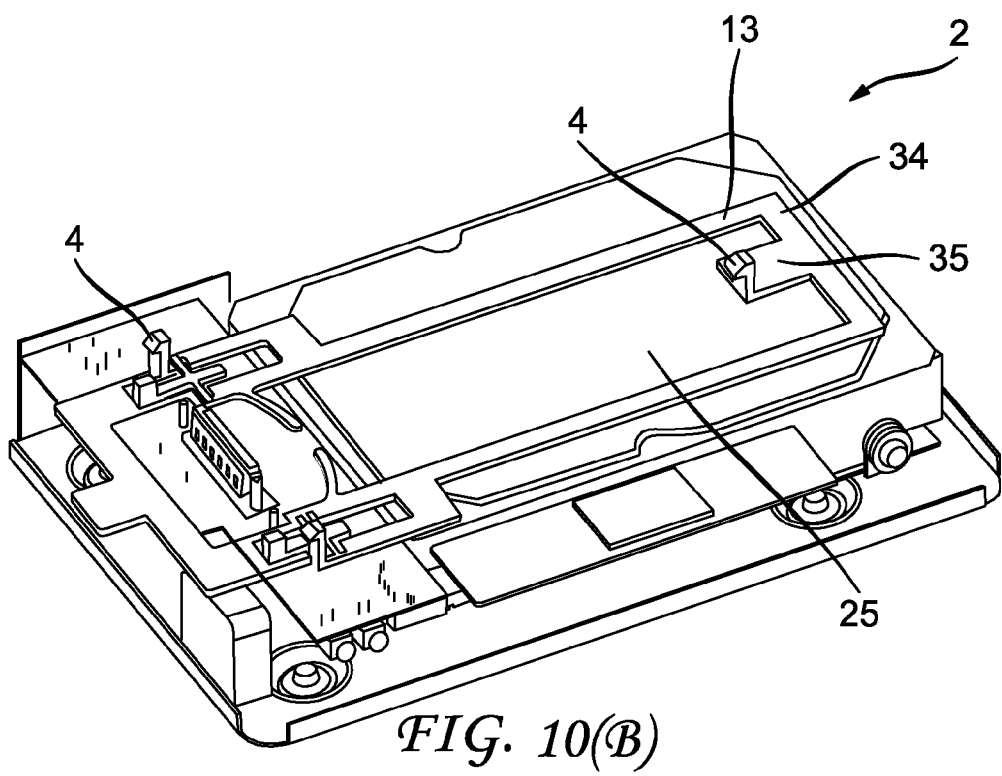

FIG. 10 shows interior views of lower electronic instrument 2 showing the top surface features of the sliding hook piece 13 in which FIG. 10A is a plan view and FIG. 10B shows a perspective view to exhibit how the hooks can extends from slide strips of the generally planar body of the sliding hook piece 13 and how a hook 4 can extend from the flat protrusion or edge 35 of the back strip portion 34. The view shows how the sliding hook piece 13 can have a hollow center region that can permit heat to transfer to the top cover 16 and permit convection or air flow to the outlet vents 27 at its top surface of the top cover 16.

Figure 11A:
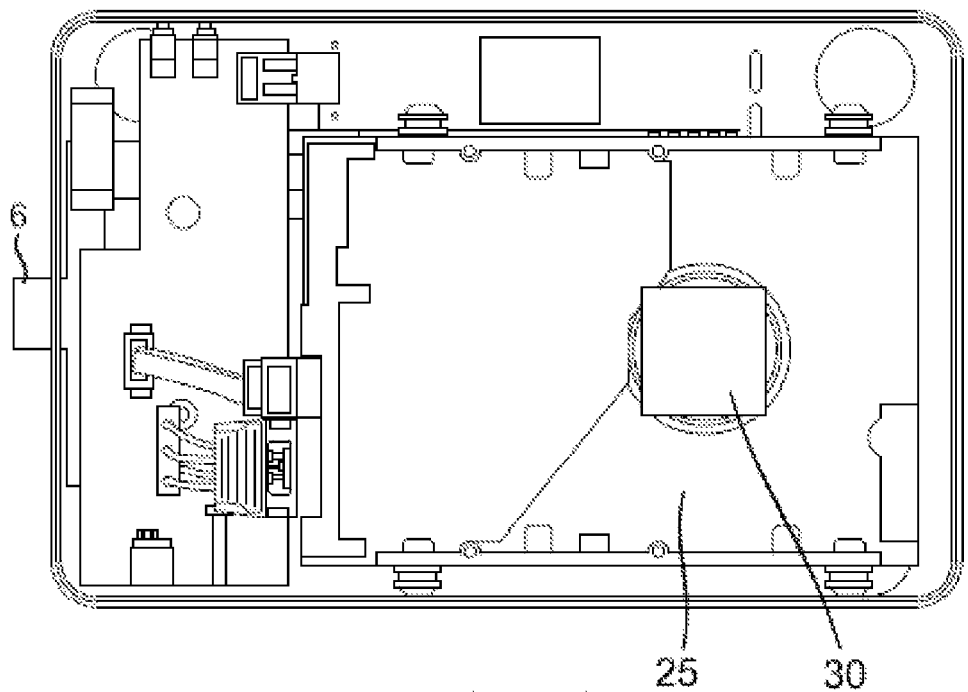
FIG. 11 shows various interior views highlighting the thermal pad 30 placement in the lower electronic instrument 2 according to the invention.
Figure 11B:
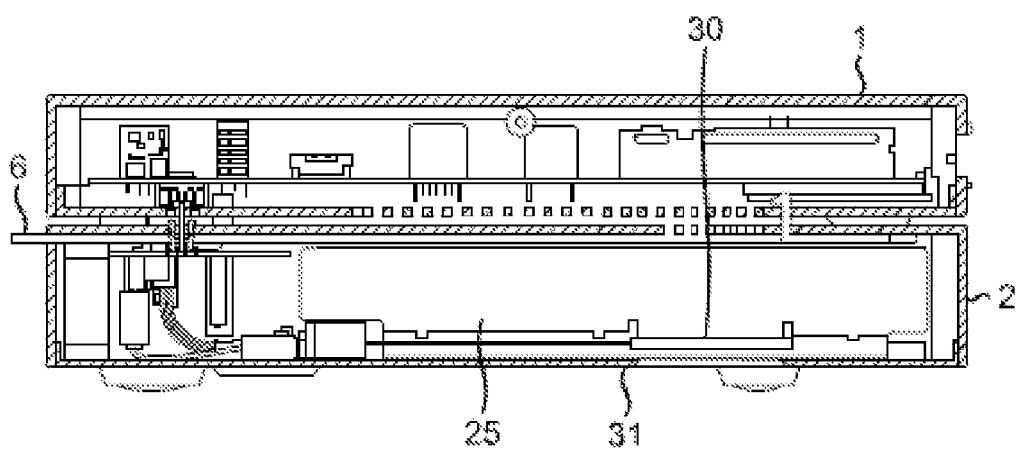

FIG. 11 provides various interior views to show how the thermal pad 30 can conduct heat to the outer casing 31 of the lower electronic instrument 2 and result is heat spreading to the outer casing 31 and radiating out of the lower electronic instrument 2.

While the invention is described with reference to specific aspects and features, it should be understood by those skilled in the art that the invention is intended to include various combination of the features and that the specific aspects and features described are representative embodiments of the invention. For example, although the examples include the sliding hook piece 13 being one unitary component, it should be understood that the piece can be several disjointed components as long as they interact as the unitary component would. Further, although the examples include the sliding hook piece 13 being in the lower instrument, it should be understood that the piece can be in the upper electronic instrument instead of the lower instrument. Additionally, the invention is intended to include the stacked instruments being in other orientations; as such, the units can be oriented to stand on their sides.

Therefore, the foregoing illustrates some of the possibilities for practicing the invention. Many other embodiments are possible within the scope and spirit of the invention. It is intended that the foregoing description be regarded as illustrative rather than limiting, and that the scope of the invention is given by the appended claims together with their full range of equivalents.

The invention claimed is:

1. A docking instrument system comprising:
 a lower electronic instrument unit having a top cover;
 at least one hook aperture and at least one lift pusher aperture in the top cover;
 a button aperture on a side wall of the lower electronic instrument unit;
 a sliding hook piece including a button at an end of the sliding hook piece that extends through the button aperture, at least one hook that extends through the hook aperture, and at least one lift pusher that extends from a first part of a flat portion of at least one lifting pushing lever and extends through the lift pusher aperture, wherein the sliding hook piece is slidably attached to the top cover; and the flat portion pivots about a hinge; and
 a second part of the flat portion located on one side of the hinge that sides upon a ramp on an interior top surface of the top cover, the ramp causing the lift pusher to move upward on the other side of the hinge when the button is pressed.

2. The docking instrument system of claim 1, wherein the sliding hook piece comprises:
 a generally planar body that is parallel to the interior top surface of the top cover, the hook extending upward from the planar body, and
 at least one lifting pushing lever from which the lift pusher extends upward; wherein the lifting pushing lever slide on the lifting means to cause the lift pusher to move upward when the button pressed.

3. The docking instrument system of claim 2, wherein the lifting pushing lever comprises a flat portion that pivots about a pivot hinge, one part of the flat portion on one side of the pivot hinge supports the lift pusher and a second part of the flat portion on a second side of the pivot hinge engages the lifting means when the button pressed, wherein the flat portion rotates about the pivot hinge as the second part engages the lifting means that causes the lift pusher to move upward.

4. The docking instrument system of claim 3, wherein the second part of the flat portion slides up the ramp when the button in pressed causing the flat portion to rotate.

5. The docking instrument system of claim 4, wherein
the interior top surface of the top cover includes at least one retaining rib; and
the sliding hook piece includes at least one spring finger that is spring loaded on the retaining rib to urge the sliding hook piece toward the button aperture.

6. The docking instrument system of claim 5, wherein the interior top surface of the top cover includes at least one retention tab that each form a slot that holds an edge of the pivot hinge, wherein the retention tab permits the sliding hook piece to be slidably attached to the top cover.

7. The docking instrument system of claim 6, wherein the generally planar body of the sliding hook piece includes a front strip portion from which the button extends and an opposing back strip portion with flat protrusion or edge;
wherein the flat protrusion or edge is positioned within at least one edge slot formed by at least one edge retention tab that forms from the interior top surface of the top cover; and
wherein the edge retention tab also permits the sliding hook piece to be slidably attached to the top cover.

8. The docking instrument system of claim 1, further comprising an upper electronic instrument unit that docks on the top cover of the lower electronic instrument unit, wherein the upper electronic instrument unit comprises at least one hook receiving aperture that engages the hook.

9. The docking instrument system of claim 8, further comprising:
at least one guide pin aperture in the upper electronic instrument unit; and
at least one guide pin that extends upward from the top cover; wherein the guide pin enters the guide pin aperture to align the upper electronic instrument unit with the lower electronic instrument unit.

10. The docking instrument system of claim 8, further comprising:
feet extending downward from the upper electronic instrument unit; and
feet pockets on the top cover; wherein the feet enter the feet pockets to align the upper electronic instrument unit with the lower electronic instrument unit.

11. The docking instrument system of claim 2, wherein the sliding hook piece is a generally planar body that is parallel to an interior top surface of the top cover, the generally planar body comprises:
a front strip portion from which the button extends;
an opposing back strip portion with flat protrusion or edge;
opposing back strip portion; and
a hollow central region defined by the front strip portion, opposing back strip portion, and the two side portions.

12. The docking instrument system of claim 11, wherein
the lower electronic instrument unit has vents in the top cover; and
the hollow central portion is directly under at least one of the vents to permit air flow between the interior of the lower electronic instrument unit and the vents.

13. The docking instrument system of claim 8, wherein
the lower electronic instrument unit has vents in the top cover;
the upper electronic instrument unit comprises bottom vents on a bottom side that face the top cover;
the sliding hook piece is a generally planar body that is parallel to an interior top surface of the top cover, the generally planar body comprises:
a front strip portion from which the button extends;
an opposing back strip portion with flat protrusion or edge;
two side strip portions that extend between the front strip portion and the opposing back strip portion; and
a hollow central region defined by the front strip portion, opposing back strip portion, and the two side portions.

14. The docking instrument system of claim 1, further comprising:
an upper electronic instrument unit that docks on the top cover of the lower electronic instrument unit, wherein the upper electronic instrument unit comprises at least one hook receiving aperture that engages the hook and an electronic connector on a bottom side that faces the top cover; and
a lower electronic connector of the lower electronic instrument unit that engages the electronic connector.

15. The docking instrument system of claim 14, further comprising:
at least one guide pin aperture in the upper electronic instrument unit; and
at least one guide pin that extends upward from the top cover; wherein the guide pin enters the guide pin aperture to align the upper electronic instrument unit with the lower electronic instrument unit and connect the lower electronic connector with the electronic connector.

\* \* \* \* \*